(12) United States Patent
Li

(10) Patent No.: US 12,143,103 B2
(45) Date of Patent: Nov. 12, 2024

(54) MULTI-COIL COUPLING-TYPE SINGLE-POLE FOUR-THROW SWITCH AND RADIO FREQUENCY INTEGRATED CIRCUIT

(71) Applicant: Xi'an Creation Keji CO., Ltd., Xi'an (CN)

(72) Inventor: Miao Li, Xi'an (CN)

(73) Assignee: XI'AN CREATION KEJI CO., LTD., Xi'an (CN)

( * ) Notice: Subject to any disclaimer, the term of this patent is extended or adjusted under 35 U.S.C. 154(b) by 25 days.

(21) Appl. No.: 17/256,860

(22) PCT Filed: Dec. 21, 2020

(86) PCT No.: PCT/CN2020/138115
§ 371 (c)(1),
(2) Date: Dec. 29, 2020

(87) PCT Pub. No.: WO2022/088446
PCT Pub. Date: May 5, 2022

(65) Prior Publication Data
US 2024/0259020 A1   Aug. 1, 2024

(30) Foreign Application Priority Data
Oct. 30, 2020   (CN) .......................... 202011192548.2

(51) Int. Cl.
H03K 17/693   (2006.01)
H03H 11/02   (2006.01)

(52) U.S. Cl.
CPC ........... *H03K 17/693* (2013.01); *H03H 11/02* (2013.01)

(58) Field of Classification Search
CPC ...... H03K 17/693; H03H 11/28; H03H 11/02; H04B 1/48
See application file for complete search history.

(56) References Cited

U.S. PATENT DOCUMENTS

2011/0105055 A1*   5/2011   Ilkov ..................... H03K 17/693
455/142

\* cited by examiner

*Primary Examiner* — Jung Kim

(57) ABSTRACT

A multi-coil coupling-type single-pole four-throw (SP4T) switch includes: an input port and first through fourth output ports; a coupled inductor circuit including inductor coils electrically connected with the input port and the first through fourth output ports; and a transistor-based control circuit including control circuits electrically connected with the first through fourth output ports respectively. The transistor-based control circuit is configured for selecting one of the first through fourth output ports to be conducted with the input port based on level signals of the control circuits, and configuring a load of the selected output port by using the inductor coils connected with the first through fourth output ports and the control circuits connected with the others of the first through fourth output ports. Therefore, the multi-coil coupling-type SP4T switch can realize selective electrical conductions among different circuits and achieve low insertion loss, high isolation degree and miniaturization.

16 Claims, 3 Drawing Sheets

MULTI-COIL COUPLING-TYPE SINGLE-POLE FOUR-THROW SWITCH AND RADIO FREQUENCY INTEGRATED CIRCUIT

TECHNICAL FIELD

The disclosure relates to the field of radio frequency integrated circuits technologies, and more particularly to a multi-coil coupling-type single-pole four-throw (SP4T) switch and a radio frequency integrated circuit.

DESCRIPTION OF RELATED ART

With the development of millimeter wave integrated circuits, switching devices are often used in radio frequency transceivers to control the switching between receiving and transmitting states in the millimeter wave integrated circuits. Insertion loss, isolation degree and linearity degree are important parameters/factors of a radio frequency integrated switch. It is usually necessary to design a switch with a low insertion loss and a high isolation degree.

However, nowadays a demand for miniaturization of the millimeter wave integrated switch is higher and higher. How to achieve a switch that can gate between different circuits and meet a requirement of the low insertion loss and the high isolation degree is an urgent problem to be solved in this field.

SUMMARY

Accordingly, in order to solve the above problems in the prior art, embodiments of the disclosure provide a multi-coil coupling-type single-pole four-throw switch and a radio frequency integrated circuit. The technical problem of the disclosure to be solved is achieved by the following technical scheme:

In a first aspect, an embodiment of the disclosure provides a multi-coil coupling-type single-pole four-throw switch including:

an input port, a first output port, a second output port, a third output port and a fourth output port;

a coupled inductor circuit, including inductor coils electrically connected with the input port, the first output port, the second output port, the third output port and the fourth output port, wherein the coupled inductor circuit is configured to isolate the first output port, the second output port, the third output port and the fourth output port; and a transistor-based control circuit, including control circuits electrically connected with the first output port, the second output port, the third output port and the fourth output port respectively; the transistor-based control circuit is configured for selecting one of the first through fourth output ports to be electrically conducted with the input port based on level signals of the control circuits, and configuring a load of the selected one of the first through fourth output ports by using the inductor coils electrically connected with the first through fourth output ports to thereby achieve a load matching for the selected one of the first through fourth output ports.

In an embodiment of the disclosure, the inductor coils of the coupled inductor circuit include: a first inductor coil, a second inductor coil and a third inductor coil; the first inductor coil is electrically connected with the input port, the second inductor coil is electrically connected between the first output port and the second output port, and the third inductor coil is electrically connected between the third output port and the fourth output port.

In an embodiment of the disclosure, the multi-coil coupling-type single-pole four-throw switch further including:

a control port group; the control port group includes a first control port, a second control port, a third control port and a fourth control port; the first control port is electrically connected with the first control circuit, the second control port is electrically connected with the second control circuit, the third control port is electrically connected with the third control circuit, the fourth control port is electrically connected with the fourth control circuit, and the control port group is configured for providing the level signals to the transistor-based control circuit.

In an embodiment of the disclosure, an nth control circuit of the control circuits includes: an nth transistor, an nth gate bias resistor and an nth external resistor electrically connected between a substrate and a source of the nth transistor, the nth is first, second, third and fourth in turn; the nth gate bias resistor is electrically connected between a gate of the nth transistor and an nth control port of the first through fourth control ports, and a drain of the nth transistor is electrically connected in parallel with an nth output port of the first through fourth output ports, the source of the nth transistor is grounded, an end of the nth external resistor is electrically connected with the substrate of the nth transistor, and another end of the nth external resistor is grounded.

In an embodiment of the disclosure, the first transistor is turned-off, and the second through fourth transistors are turned-on, when the level signal provided by the first control port is at a first voltage level, and the level signals provided by the second through fourth control ports are at a second voltage level, so that the input port is electrically conducted with the first output port.

In an embodiment of the disclosure, the second transistor is turned-off, and the first transistor, the third transistor as well as the fourth transistor are turned-on, when the level signal provided by the second control port is at a first voltage level, and the level signals provided by the first control port, the third control port as well as the fourth control port are at a second voltage level, so that the input port is electrically conducted with the second output port.

In an embodiment of the disclosure, the third transistor is turned-off, and the first transistor, the second transistor as well as the fourth transistor are turned-on, when the level signal provided by the third control port is at a first voltage level, and the level signals provided by the first control port, the second control port as well as the fourth control port are at a second voltage level, so that the input port is electrically conducted with the third output port.

In an embodiment of the disclosure, the fourth transistor is turned-off, and the first through third transistors are turned-on, when the level signal provided by the fourth control port is at a first voltage level, and the level signals provided by the first through third control ports are at a second voltage level, so that the input port is electrically conducted with the fourth output port.

In an embodiment of the disclosure, the multi-coil coupling-type single-pole four-throw switch further including: a bypass capacitor, an end of the bypass capacitor is electrically connected with the first inductor coil, and another end of the bypass capacitor is grounded.

In a second aspect, an embodiment of the disclosure provides a radio frequency integrated circuit, including: the above-mentioned multi-coil coupling-type single-pole four-throw switch.

The multi-coil coupling-type single-pole four-throw switch and the radio frequency integrated circuit of the embodiments of the disclosure, the high isolation degrees between ports are achieved by using the coupled inductor circuit, one of the first through fourth output ports is selected to be electrically conducted with the input port based on the level signals of the control circuits, and the load of the selected one of the first through fourth output ports is configured by using the inductor coils electrically connected with the first through fourth output ports and the control circuits electrically connected with the others of the first through fourth output ports to thereby achieve the load matching for the selected one of the first through fourth output ports, the purpose of reducing insertion loss is achieved by changing the load of the output port, a miniaturized switch that can realize selective electrical conductions among different circuits and have low insertion loss and high isolation degree is achieved.

Of course, it is not necessary to achieve all the advantages mentioned above at the same time to implement any product or method of the disclosure.

The disclosure will be further described in detail with reference to the attached drawings and embodiments.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative efforts.

DETAILED DESCRIPTION OF EMBODIMENTS

The technical solutions in the embodiments of the disclosure will be clearly and completely described below, with reference to the accompanying drawings in the embodiments of the disclosure. Apparently, the described embodiments are merely some of the embodiments of the disclosure, not all embodiments. Based on the described embodiments of the disclosure, all the other embodiments obtained by those skilled in the art without any creativity should belong to the protection scope of the disclosure.

In order to achieve a miniaturized switch that can realize selective electrical conductions among different circuits and have low insertion loss and high isolation, embodiments of the disclosure provide a multi-coil coupling-type single-pole four-throw (SP4T) switch and a radio frequency integrated circuit.

In a first aspect, the embodiment of the disclosure provides a multi-coil coupling-type single-pole four-throw switch. Next, the multi-coil coupling-type single-pole four-throw switch is introduced.

Figure 1:
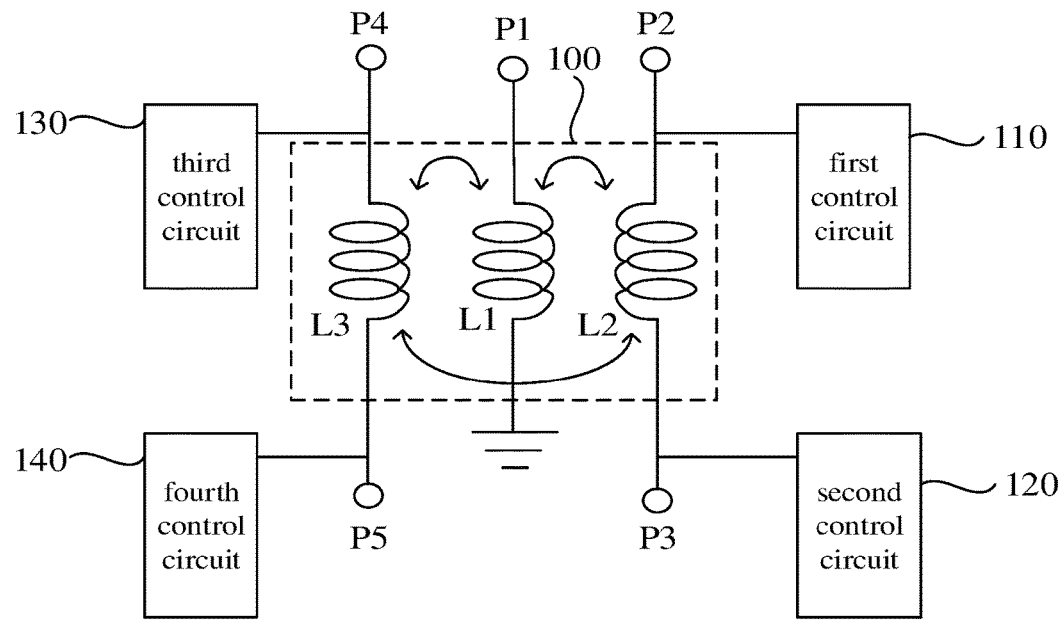
FIG. 1 is a schematic view of a circuit structure of a multi-coil coupling-type single-pole four-throw switch according to an embodiment of the disclosure.

Referring to FIG. 1, FIG. 1 is a schematic view of a circuit structure of the multi-coil coupling-type single-pole four-throw switch provided by the embodiment of the disclosure, including:

an input port P1, a first output port P2, a second output port P3, a third output port P4 and a fourth output port P5;

a coupled inductor circuit 100, including inductor coils electrically connected with the input port P1, the first output port P2, the second output port P3, the third output port P4 and the fourth output port P5; in an exemplary embodiment, the coupled inductor circuit 100 is configured to isolate the first output port P2, the second output port P3, the third output port P4 and the fourth output port P5; and a transistor-based control circuit, including control circuits electrically connected with the first output port P2, the second output port P3, the third output port P4 and the fourth output port P5 respectively; In an exemplary embodiment, the transistor-based control circuit is configured for selecting one of the first through fourth output ports to be electrically conducted with the input port based on level signals of the control circuits, and configuring a load of the selected one of the first through fourth output ports by using the inductor coils electrically connected with the others of the first through fourth output ports to thereby achieve a load matching for the selected one of the first through fourth output ports.

It can be understood that, the coupled inductor circuit 100 can isolate the input port P1, the first output port P2, the second output port P3, the third output port P4 and the fourth output port P5 by using the inductor coils, and improve the isolation degree between the input port P1 and each output port, each output port such as each of the first output port P2, the second output port P3, the third output port P4 and the fourth output port P5.

The transistor-based control circuit includes: a first control circuit 110, a second control circuit 120, a third control circuit 130 and a fourth control circuit 140. The first control circuit 110 is electrically connected with the first output port P2. The second control circuit 120 is electrically connected with the second output port P3. The third control circuit 130 is electrically connected with the third output port P4. The fourth control circuit 140 is electrically connected with the fourth output port P5.

In an exemplary embodiment, each control circuit is configured with a corresponding level signal (e.g., control voltage level), and different working states can be achieved under the different level signals. According to the embodiment of the disclosure, the working states of each control circuit are controlled by configuring the level signals of each control circuit, so that the input port is electrically conducted with one of the first through fourth output ports, thereby a purpose of realizing selective electrical conductions among the different circuits can be achieved. In addition, after one of the first through fourth output ports is selected, a load of the selected one of the first through fourth output ports is configured by using the inductor coils electrically connected with the first through fourth output ports and the control circuits electrically connected with the others of the first through fourth output ports to thereby achieve a load matching for the selected one of the first through fourth output ports. The embodiment of the disclosure configures the load of the output port is different for different output ports, so that the purpose of reducing the insertion losses of the electrical conducted circuits can be achieved.

In addition, the λ/4 transmission line is usually used for the load matching in this field, but it needs a large layout area, which is not beneficial to on-chip integration. However, in the embodiment of the disclosure, the inductor coil and the control circuit are used to achieve the load matching, so the area can be reduced, which is beneficial to on-chip integration and achieves a miniaturized switch.

According to the multi-coli coupling-type single-pole four-throw switch provided by the embodiment of the disclosure, the high isolation degrees between ports are achieved by using the coupled inductor circuit, one of the first through fourth output ports is selected to be electrically conducted with the input port based on the level signals of the control circuits, and the load of the selected one of the first through fourth output ports is configured by using the inductor coils electrically connected with the first through fourth output ports and the control circuits electrically connected with the others of the first through fourth output ports to thereby achieve the load matching for the selected one of the first through fourth output ports, the purpose of reducing insertion loss is achieved by changing the load of the output port, a miniaturized switch that can realize selective electrical conductions among different circuits and have low insertion loss and high isolation degree is achieved.

Figure 2:
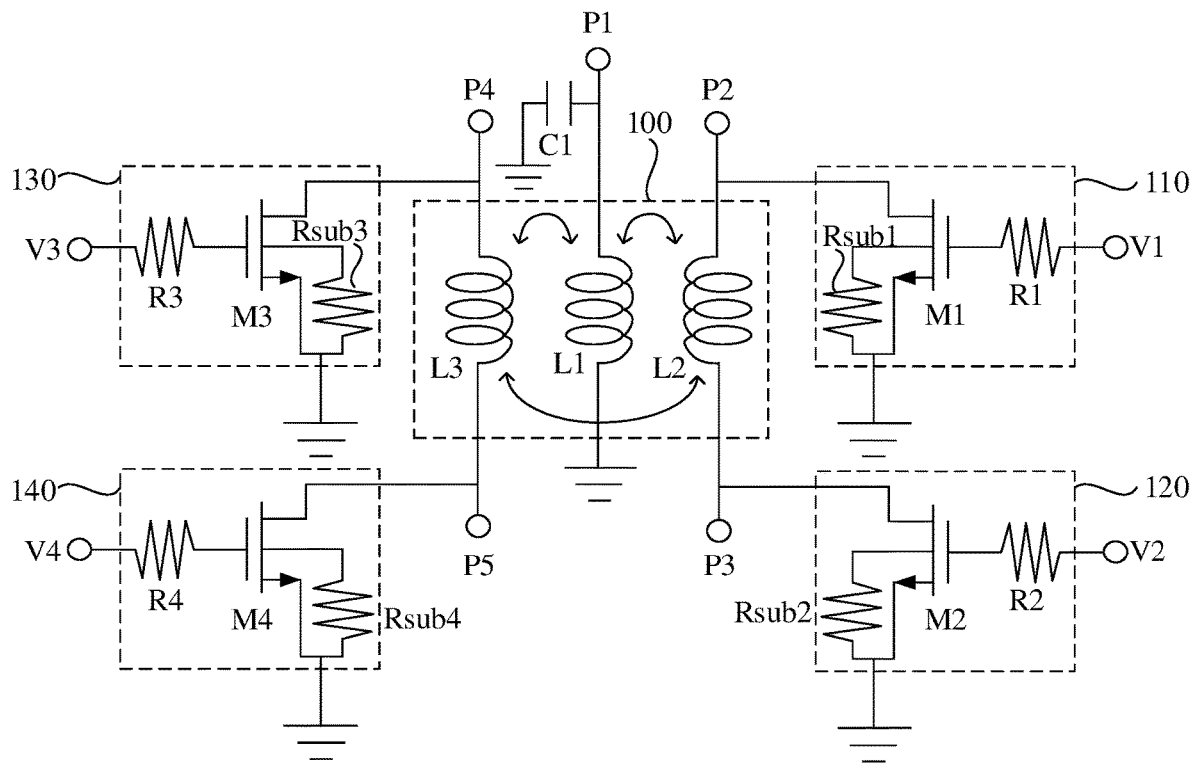
FIG. 2 is a schematic view of a detailed circuit structure of the multi-coil coupling-type single-pole four-throw switch according to an embodiment of the disclosure.

An optional embodiment of a structure of the multi-coil coupling-type single-pole four-throw switch provided by the embodiment of the disclosure will be described below. Please refer to FIG. 2 for details. FIG. 2 is a schematic view of a detailed circuit structure of the multi-coil coupling-type single-pole four-throw switch according to an embodiment of the disclosure.

In an optional way, the inductor coils of the coupled inductor circuit 100 include: a first inductor coil L1, a second inductor coil L2 and a third inductor coil L3; the first inductor coil L1 is electrically connected with the input port P1, the second inductor coil L2 is electrically connected between the first output port P2 and the second output port P3, and the third inductor coil L3 is electrically connected between the third output port P4 and the fourth output port P5.

In an optional way, the multi-coil coupling-type single-pole four-throw switch of an embodiment of the disclosure, further including: a control port group. In an exemplary embodiment, the control port group includes a first control port V1, a second control port V2, a third control port V3 and a fourth control port V4; the first control port V1 is electrically connected with the first control circuit 110, the second control port V2 is electrically connected with the second control circuit 120, the third control port V3 is electrically connected with the third control circuit 130, the fourth control port V4 is electrically connected with the fourth control circuit 140, and the control port group is configured for providing the level signals to the transistor-based control circuit.

In an optional way, an nth control circuit of the control circuits includes: an nth transistor Mn, an nth gate bias resistor Rn and an nth external resistor Rsubn electrically connected between a substrate and a source of the nth transistor Mn, the nth is first, second, third and fourth in turn; the nth gate bias resistor Rn is electrically connected between a gate of the nth transistor Mn and an nth control port Vn of the first through fourth control ports, and a drain of the nth transistor Mn is electrically connected in parallel with an nth output port of the first through fourth output ports, the source of the nth transistor Mn is grounded, an end of the nth external resistor Rsubn is electrically connected with the substrate of the nth transistor Mn, and another end of the nth external resistor Rsubn is grounded.

Specifically, when the nth is first, second, third and fourth in turn, the nth control circuit corresponds to the first control circuit 110, the second control circuit 120, the third control circuit 130 and the fourth control circuit 140. The first control port V1, the second control port V2, the third control port V3 and the fourth control port V4 provide the level signals to the first control circuit 110, the second control circuit 120, the third control circuit 130, and the fourth control circuit 140 respectively.

Then, the specific structure corresponding the nth control circuit is as follows:

the first control circuit 110 includes: a first transistor M1, a first gate bias resistor R1 and a first external resistor Rsub1 electrically connected between a substrate and a source of the first transistor M1; the first gate bias resistor R1 is electrically connected between a gate of the first transistor M1 and the first control port V1, and a drain of the first transistor M1 is electrically connected in parallel with the first output port P2, the source of the first transistor M1 is grounded, an end of the first external resistor Rsub1 is electrically connected with the substrate of the first transistor M1, and another end of the first external resistor Rsub1 is grounded.

the second control circuit 120 includes: a second transistor M2, a second gate bias resistor R2 and a second external resistor Rsub2 electrically connected between a substrate and a source of the second transistor M2; the second gate bias resistor R2 is electrically connected between a gate of the second transistor M2 and the second control port V2, and a drain of the second transistor M2 is electrically connected in parallel with the second output port P3, the source of the second transistor M2 is grounded, an end of the second external resistor Rsub2 is electrically connected with the substrate of the second transistor M2, and another end of the second external resistor Rsub2 is grounded.

the third control circuit 130 includes: a third transistor M3, a third gate bias resistor R3 and a third external resistor Rsub3 electrically connected between a substrate and a source of the third transistor M3; the third gate bias resistor R3 is electrically connected between a gate of the third transistor M3 and the third control port V3, and a drain of the third transistor M3 is electrically connected in parallel with the third output port P4, the source of the third transistor M3 is grounded, an end of the third external resistor Rsub3 is electrically connected with the substrate of the third transistor M3, and another end of the third external resistor Rsub3 is grounded.

the fourth control circuit 140 includes: a fourth transistor M4, a fourth gate bias resistor R4 and a fourth external resistor Rsub4 electrically connected between a substrate and a source of the fourth transistor M4; the fourth gate bias resistor R4 is electrically connected between a gate of the fourth transistor M4 and the fourth control port V4, and a drain of the fourth transistor M4 is electrically connected in parallel with the fourth output port P5, the source of the fourth transistor M4 is grounded, an end of the fourth external resistor Rsub4 is electrically connected with the substrate of the fourth transistor M4, and another end of the fourth external resistor Rsub4 is grounded.

It should be noted that, the first gate bias resistor R1, the second gate bias resistor R2, the third gate bias resistor R3 and the fourth gate bias resistor R4 are configured to improve the isolation degrees between switching radio frequency signals and level signals.

The first external resistor Rsub1, the second external resistor Rsub2, the third external resistor Rsub3 and the fourth external resistor Rsub4 are configured to reduce the resistances of the substrates of the transistors connected with them, which can reduce the insertion losses.

Further, the multi-coil coupling-type single-pole four-throw switch provided by an embodiment of the disclosure further includes a bypass capacitor C1. In an exemplary embodiment, an end of the bypass capacitor C1 is electrically connected with the first inductor coil L1, and another end of the bypass capacitor C1 is grounded.

It can be understood by those skilled in the art that the bypass capacitor can bypass and filter out the high-frequency components in the AC signal mixed with the high-frequency current and the low-frequency current, and can take the high-frequency noise in the signal of the input port P1 as a filtering object and filter out the high-frequency clutter carried by the previous stage.

The working states of the multi-coil coupling-type single-pole four-throw switch are described below, so as to facilitate understanding of the working principle of the multi-coil coupling-type single-pole four-throw switch of the disclosure.

FIG. 3 through FIG. 6 respectively are schematic views of equivalent circuit structures of the multi-coil coupling-type single-pole four-throw switch at different voltage levels according to embodiments of the disclosure.

Figure 3:
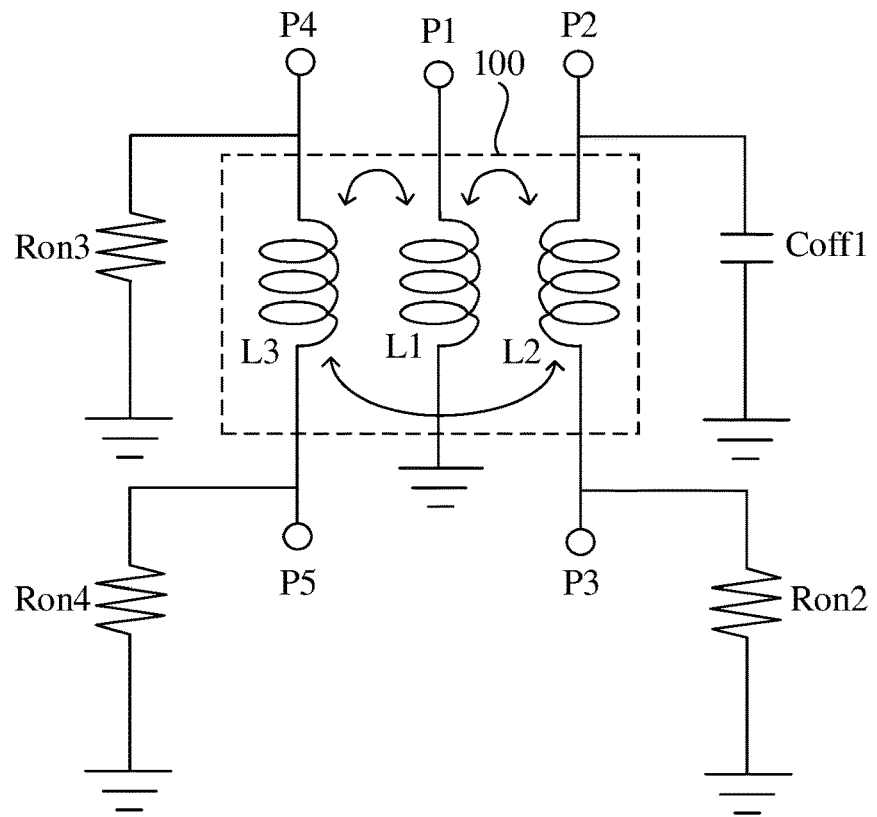
FIG. 3 through FIG. 6 respectively are schematic views of equivalent circuit structures of the multi-coil coupling-type single-pole four-throw switch at different voltage levels according to embodiments of the disclosure.

Referring to FIG. 3, FIG. 3 is a schematic view of the equivalent circuit structure when a first voltage level is provided for the first control circuit.

In this embodiment, the first transistor M1 is turned-off, and the second transistor M2, the third transistor M3 as well as the fourth transistor M4 are turned-on, when the level signal provided by the first control port V1 is at the first voltage level, and the level signals provided by the second control port V2, the third control port V3 as well as the fourth control port V4 are at a second voltage level, so that the input port P1 is electrically conducted with the first output port P2.

The level signals are signals represented by voltage levels, including a high level "1" and a low level "0".

In an optional embodiment: the first voltage level is the low level, such as 0; the second voltage level is the high level, such as 1. It is understood from FIG. 3 that, the level signal of the first control circuit 110 is also the low level because the first control port V1 provides the low level, the level signals of the second control circuit 120, the third control circuit 130 and the fourth control circuit 140 are also the high level because the second control port V2, the third control port V3 and the fourth control port V4 provide the high level. it can be understood by those skilled in the art that according to the working principle of the transistor, the first transistor M1 is turned-off, and at this time, the first transistor M1 is equivalent to a transistor turn-off capacitor Coff1, the second transistor M2, the third transistor M3 and the fourth transistor M4 are turned-on, and at this time, the second transistor M2 is equivalent to a transistor on-resistance Ron2, the third transistor M3 is equivalent to a transistor on-resistance Ron3, the fourth transistor M4 is equivalent to a transistor on-resistance Ron4, at the same time, it also includes the parasitic capacitances of the second transistor M2, the third transistor M3 and the fourth transistor M4 respectively. Those skilled in the art can understand that, at this time, the transistor turn-off capacitor Coff1 is equivalent to a bypass capacitor of the first output port P2, so that the level signal is transmitted from the input port P1 to the first output port P2; the transistor on-resistance Ron2 is equivalent to a load of the second output port P3, and the transistor on-resistance Ron2 short-circuits the second output port P3 to ground, so the input port P1 is electrically unconducted with the second output port P3; the transistor on-resistance Ron3 is equivalent to a load of the third output port P4, and the transistor on-resistance Ron3 short-circuits the third output port P4 to ground, so the input port P1 is electrically unconducted with the third output port P3; the transistor on-resistance Ron4 is equivalent to a load of the fourth second output port P5, and the transistor on-resistance Ron4 short-circuits the fourth output port P5 to ground, so the input port P1 is electrically unconducted with the fourth output port P5. In addition, the second inductor coil L2, the third inductor coil L3, the parasitic capacitance of the second transistor M2, the parasitic capacitance of the third transistor M3, and the parasitic capacitance of the fourth transistor M4 serve as the load of the first output port P2.

Figure 4:
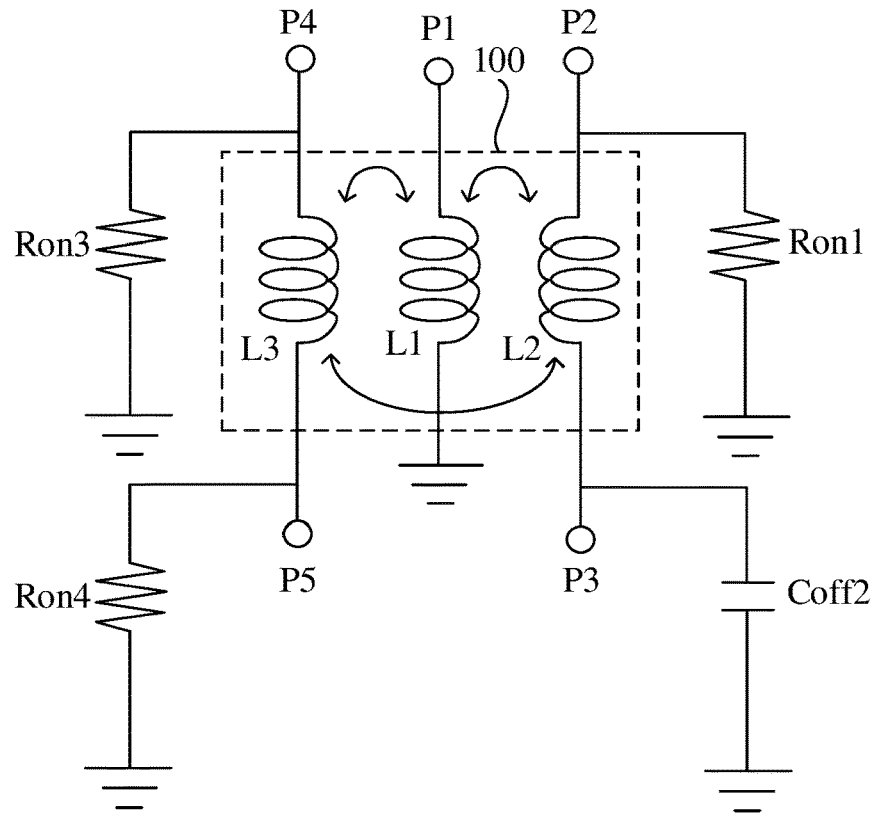

Referring to FIG. 4, FIG. 4 is a schematic view of the equivalent circuit structure when the first voltage level is provided for the second control circuit.

In the embodiment, the second transistor M2 is turned-off, and the first transistor M1, the third transistor M3 as well as the fourth transistor M4 are turned-on, when the level signal provided by the second control port V2 is at the first voltage level, and the level signals provided by the first control port V1, the third control port V3 as well as the fourth control port V4 are at the second voltage level, so that the input port P1 is electrically conducted with the second output port P3.

In an optional embodiment: the first voltage level is the low level, such as 0; the second voltage level is the high level, such as 1. It is understood from FIG. 4 that, the level signal of the second control circuit 120 is also the low level because the second control port V2 provides the low level, the level signals of the first control circuit 110, the third control circuit 130 and the fourth control circuit 140 are also the high level because the first control port V1, the third control port V3 and the fourth control port V4 provide the high level. it can be understood by those skilled in the art that according to the working principle of the transistor, the second transistor M2 is turned-off, and at this time, the second transistor M2 is equivalent to a transistor turn-off capacitor Coff2, the first transistor M1, the third transistor M3 and the fourth transistor M4 are turned-on, and at this time, the first transistor M1 is equivalent to a transistor on-resistance Ron1, the third transistor M3 is equivalent to a transistor on-resistance Ron3, the fourth transistor M4 is equivalent to a transistor on-resistance Ron4, at the same time, it also includes the parasitic capacitances of the first transistor M1, the third transistor M3 and the fourth transistor M4 respectively. At this time, the transistor turn-off capacitor Coff2 is equivalent to a bypass capacitor of the second output port P3, so that the level signal is transmitted from the input port P1 to the second output port P3; the transistor on-resistance Ron1 is equivalent to a load of the first output port P2, and the transistor on-resistance Ron1 short-circuits the first output port P2 to ground, so the input port P1 is electrically unconducted with the first output port P2; the transistor on-resistance Ron3 is equivalent to a load of the third output port P4, and the transistor on-resistance Ron3 short-circuits the third output port P4 to ground, so the input port P1 is electrically unconducted with the third output port P4; the transistor on-resistance Ron4 is equivalent to a load of the fourth output port P5, and the transistor on-resistance Ron4 short-circuits the fourth output port P5 to ground, so the input port P1 is electrically unconducted with the fourth output port P5. In addition, the second inductor coil L2, the third inductor coil L3, the parasitic capacitance of the first transistor M1, the parasitic capacitance of the third transistor M3, and the parasitic capacitance of the fourth transistor M4 serve as the load of the second output port P3.

Figure 5:
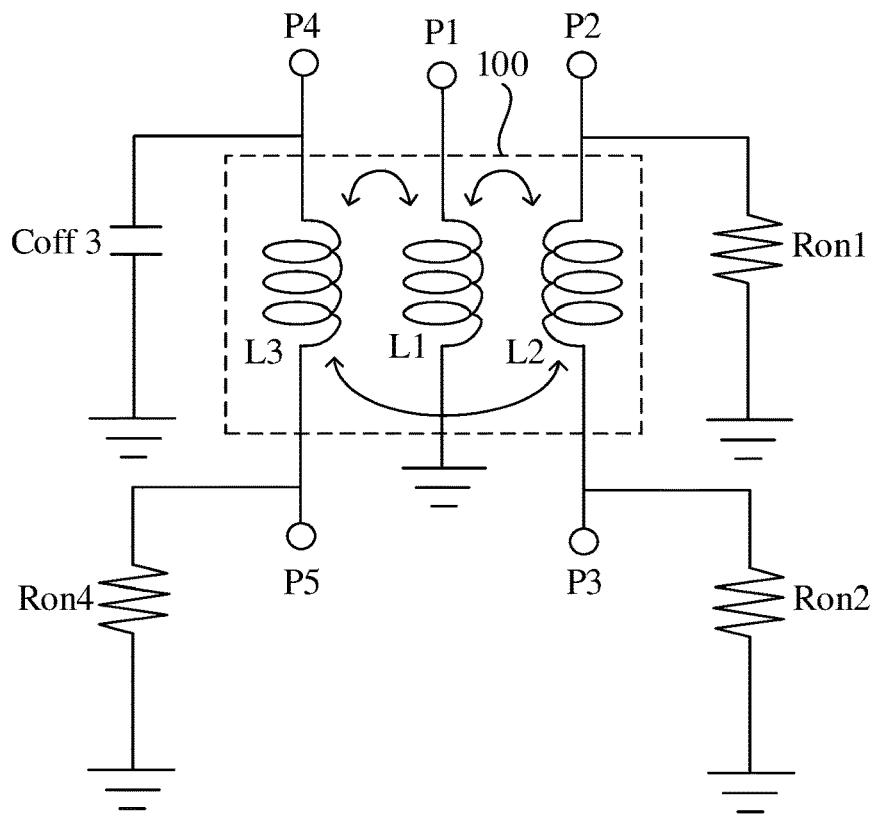

Referring to FIG. 5, FIG. 5 is a schematic view of the equivalent circuit structure when the first level voltage is provided for the third control circuit.

In the embodiment, the third transistor M3 is turned-off, and the first transistor M1, the second transistor M2 as well as the fourth transistor M4 are turned-on, when the level signal provided by the third control port V3 is at the first voltage level, and the level signals provided by the first control port V1, the second control port V2 as well as the fourth control port V4 are at the second voltage level, so that the input port P1 is electrically conducted with the third output port P4.

In an optional embodiment: the first voltage level is the low level, such as 0; the second voltage level is the high level, such as 1. It is understood from FIG. 5 that, the level signal of the third control circuit 130 is also the low level because the third control port V3 provides the low level, the level signals of the first control circuit 110, the second control circuit 120 and the fourth control circuit 140 are also the high level because the first control port V1, the second control port V2 and the fourth control port V4 provide the high level. it can be understood by those skilled in the art that according to the working principle of the transistor, the third transistor M3 is turned-off, and at this time, the third transistor M3 is equivalent to a transistor turn-off capacitor Coff3, the first transistor M1, the second transistor M2 and the fourth transistor M4 are turned-on, and at this time, the first transistor M1 is equivalent to a transistor on-resistance Ron1, the second transistor M2 is equivalent to a transistor on-resistance Ron2, the fourth transistor M4 is equivalent to a transistor on-resistance Ron4, at the same time, it also includes the parasitic capacitances of the first transistor M1, the second transistor M2 and the fourth transistor M4 respectively. At this time, the transistor turn-off capacitor Coff3 is equivalent to a bypass capacitor of the third output port P4, so that the level signal is transmitted from the input port P1 to the third output port P4; the transistor on-resistance Ron1 is equivalent to a load of the first output port P2, and the transistor on-resistance Ron1 short-circuits the first output port P2 to ground, so the input port P1 is electrically unconducted with the first output port P2; the transistor on-resistance Ron2 is equivalent to a load of the second output port P3, and the transistor on-resistance Ron2 short-circuits the second output port P3 to ground, so the input port P1 is electrically unconducted with the second output port P3; the transistor on-resistance Ron4 is equivalent to a load of the fourth output port P5, and the transistor on-resistance Ron4 short-circuits the fourth output port P5 to ground, so the input port P1 is electrically unconducted with the fourth output port P5. In addition, the second inductor coil L2, the third inductor coil L3, the parasitic capacitance of the first transistor M1, the parasitic capacitance of the second transistor M2, and the parasitic capacitance of the fourth transistor M4 serve as the load of the third output port P4.

Figure 6:
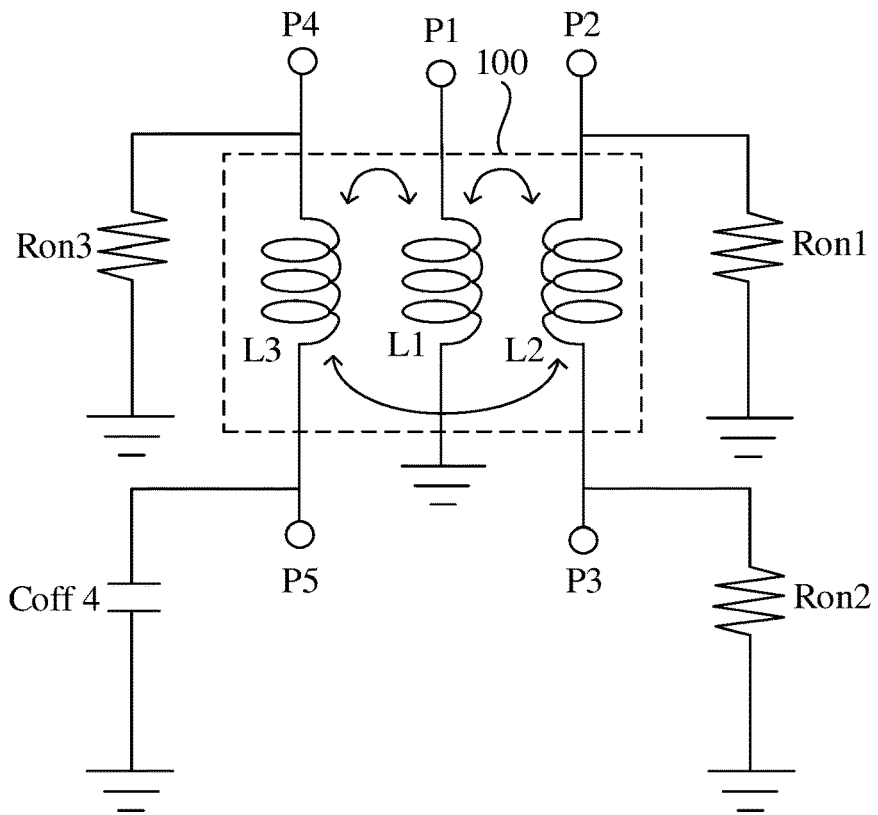

Referring to FIG. 6, FIG. 6 is a schematic view of the equivalent circuit structure when the first voltage level is provided for the fourth control circuit.

In the embodiment, the fourth transistor M4 is turned-off, and the first transistor M1, the second transistor M2 as well as the third transistor M3 are turned-on, when the level signal provided by the fourth control port V4 is at the first voltage level, and the level signals provided by the first control port V1, the second control port V2 as well as the third control port V3 are at the second voltage level, so that the input port P1 is electrically conducted with the fourth output port P5.

In an optional embodiment: the first voltage level is the low level, such as 0; the second voltage level is the high level, such as 1. It is understood from FIG. 6 that, the level signal of the fourth control circuit 140 is also the low level because the fourth control port V4 provides the low level, the level signals of the first control circuit 110, the second control circuit 120 and the third control circuit 130 are also the high level because the first control port V1, the second control port V2 and the third control port V3 provide the high level. it can be understood by those skilled in the art that according to the working principle of the transistor, the fourth transistor M4 is turned-off, and at this time, the fourth transistor M4 is equivalent to a transistor turn-off capacitor Coff4, the first transistor M1, the second transistor M2 and the third transistor M3 are turned-on, and at this time, the first transistor M1 is equivalent to a transistor on-resistance Ron1, the second transistor M2 is equivalent to a transistor on-resistance Ron2, the third transistor M3 is equivalent to a transistor on-resistance Ron3, at the same time, it also includes the parasitic capacitances of the first transistor M1, the second transistor M2 and the third transistor M3 respectively. At this time, the transistor turn-off capacitor Coff4 is equivalent to a bypass capacitor of the fourth output port P5, so that the level signal is transmitted from the input port P1 to the fourth output port P5; the transistor on-resistance Ron1 is equivalent to a load of the first output port P2, and the transistor on-resistance Ron1 short-circuits the first output port P2 to ground, so the input port P1 is electrically unconducted with the first output port P2; the transistor on-resistance Ron2 is equivalent to a load of the second output port P3, and the transistor on-resistance Ron2 short-circuits the second output port P3 to ground, so the input port P1 is electrically unconducted with the second output port P3; the transistor on-resistance Ron3 is equivalent to a load of the third output port P4, and the transistor on-resistance Ron3 short-circuits the third output port P4 to ground, so the input port P1 is electrically unconducted with the third output port P4. In addition, the second inductor coil L2, the third inductor coil L3, the parasitic capacitance of the first transistor M1, the parasitic capacitance of the second transistor M2, and the parasitic capacitance of the third transistor M3 serve as the load of the fourth output port P4.

In order to verify the working effect of the multi-coil coupling-type single-pole four-throw switch provided by the embodiment of the disclosure, the following describes the specific parameters and simulation results of the multi-coil coupling-type single-pole four-throw switch.

In an optional embodiment, a first transistor M1 consists of six groups of field effect transistors, and each group of field effect transistors includes 64 channels, with a channel width of 1 um, and a channel length of 40 nm. A second transistor M2 consists of six groups of field effect transistors, and each group of field effect transistors includes 64 channels, with a channel width of 1 um and a channel length of 40 nm. A third transistor M3 consists of six groups of field effect transistors, and each group of field effect transistors includes 64 channels, with a channel width of 1 um, and a channel length of 40 nm. A fourth transistor M4 consists of six groups of field effect transistors, and each group of field effect transistors includes 64 channels, with a channel width of 1 um, and a channel length of 40 nm.

The resistance values of a first gate bias resistor R1, a second gate bias resistor R2, a third gate bias resistor R3 and a fourth gate bias resistor R4 are all 3 KΩ.

The resistance values of a first external resistor Rsub1, a second external resistor Rsub2, a third external resistor Rsub3 and a fourth external resistor Rsub4 are all 6 KΩ, and the capacitance of a bypass capacitor C1 is 40 fF.

According to the above structural parameters, the multi-coil coupling-type single-pole four-throw switch can achieve that an application frequency range includes 40 GHz~55 GHz. In the application frequency range, mismatch degrees of insertion loss between the input port P1 and each output port are less than 0.24 dB, insertion losses between the input port P1 and each output port are less than 2.2 dB, and isolation degrees between the input port P1 and each output port are greater than 23.2 dB. Each output port is each of the first through fourth output ports.

It should be noted that, the structural parameters in multi-coil coupling-type single-pole four-throw switch provided by the embodiment of the disclosure are not limited to this, and those skilled in the art can think that structures with different parameters can achieve the same effect according to different use conditions.

In this embodiment, by using the principle that transistors are turned on or off at different level signals, by controlling the level signals of the control port group, the level signal provided by the transistor of one of the first through fourth control circuits is opposite to those provided by the transistors of the others of the first through fourth control circuits, so the switching of the first through fourth output ports can be achieved. At the same time, by switching the loads of the output ports, the insertion loss is lower when the input port is electrically conducted with different output ports.

Moreover, compared with the multi-coil coupling-type single-pole four-throw switch shown in FIG. 1, the isolation degrees between radio frequency signals and level signals can be improved through the gate bias resistance of the transistor-based control circuit, and the resistance of the substrate of the transistor can be reduced through the external resistance to achieve the purpose of reducing the insertion loss, it ensures that the multi-coil coupling-type single-pole four-throw switch has low insertion loss and high isolation degree performance under different working conditions, and can achieve a good matching between the input port and the four output ports of the millimeter wave integrated circuit switch.

In a second aspect, a radio frequency integrated circuit is provided by an embodiment of the disclosure, including: the above-mentioned multi-coil coupling-type single-pole four-throw switch.

In the embodiment, the multi-coil coupling-type single-pole four-throw switch can be packaged into a radio frequency integrated circuit, which can be applied to a radio frequency front-end equipment, such as a low-noise amplifier, a filter, an attenuator, and a phase shifter, etc.

In this embodiment, by using the principle that transistors are turned on or off at different level signals, by controlling the level signals of the control port group, the level signal provided by the transistor of one of the first through fourth control circuits is opposite to those provided by the transistors of the others of the first through fourth control circuits, so the switching of the first through fourth output ports can be achieved. At the same time, by switching the loads of the output ports, the insertion loss is lower when the input port is electrically conducted with different output ports. Moreover, the isolation degrees between radio frequency signals and level signals can be improved through the gate bias resistance of the transistor-based control circuit, and the resistance of the substrate of the transistor can be reduced through the external resistance to achieve the purpose of reducing the insertion loss, it ensures that the multi-coil coupling-type single-pole four-throw switch has low insertion loss and high isolation degree performance under different working conditions, and can achieve a good matching between the input port and the four output ports of the millimeter wave integrated circuit switch.

It should be noted that the terms "first" and "second" in the description and claims of the disclosure and the above drawings are used to distinguish similar objects, rather than to limit a specific order or sequence. It should be understood that the terms used in this way can be interchanged under appropriate circumstances so that the embodiments of the disclosure described herein can be implemented in an order other than those illustrated or described herein. In addition, the terms "including" and "having" and any variations thereof are intended to cover non-exclusive inclusions, for example, a process, method, system, product, or device containing a series of steps or units need not be limited to the clearly listed step(s) or unit(s), but may include other step(s) or unit(s) not explicitly listed or inherent to the process, method, system, product, or device.

All the embodiments in this specification are described in a related way, and the same and similar parts among the embodiments can be referred to each other. Each embodiment focuses on the differences from other embodiments. Especially, for the system embodiment, because it is basically similar to the method embodiment, the description is relatively simple, and relevant points can be found in the partial description of the method embodiment.

It is understood that the foregoing embodiments are only exemplary descriptions of the disclosure. On the premise that the technical features are not in conflict, the structures are not contradictory and the purpose of the disclosure is not violated, the technical solutions of various embodiment can be arbitrarily combined and used together.

Finally, it should be noted that the above embodiments are only used to illustrate the technical solutions of the invention, rather than to limit the invention. Although the invention has been described in detail with reference to the foregoing embodiments, those of ordinary skill in the art should understand that the technical solutions illustrated in the foregoing embodiments may be modified, or some of the technical features may be equivalently substituted. These modifications or substitutions do not make the essence of corresponding technical solutions deviate from the spirit and scope of the technical solutions of various embodiments of the invention.

What is claimed is:

1. A multi-coil coupling-type single-pole four-throw (SP4T) switch, comprising:
  an input port, a first output port, a second output port, a third output port and a fourth output port;
  a coupled inductor circuit, comprising inductor coils electrically connected with the input port, the first output port, the second output port, the third output port and the fourth output port, wherein the coupled inductor circuit is configured to isolate the first output port, the second output port, the third output port and the fourth output port; and a transistor-based control circuit, comprising control circuits electrically connected with the first output port, the second output port, the third output port and the fourth output port respectively; wherein the transistor-based control circuit is configured for selecting one of the first through fourth output ports to be electrically conducted with the input port based on level signals of the control circuits, and configuring a load of the selected one of the first through fourth output ports by using the inductor coils electrically connected with the first through fourth output ports and the control circuits electrically connected with the others of the first through fourth output ports to thereby achieve a load matching for the selected one of the first through fourth output ports; and wherein the inductor coils of the coupled inductor circuit comprise: a first inductor coil, a second inductor coil and a third inductor coil; the first inductor coil is electrically connected with the input port, the second inductor coil is electrically connected between the first output port and the second output port, and the third inductor coil is electrically connected between the third output port and the fourth output port.

2. The multi-coil coupling-type SP4T switch as claimed in claim 1, further comprising:

a control port group, wherein the control port group comprises a first control port, a second control port, a third control port and a fourth control port; the first control port is electrically connected with the first control circuit, the second control port is electrically connected with the second control circuit, the third control port is electrically connected with the third control circuit, the fourth control port is electrically connected with the fourth control circuit, and the control port group is configured for providing the level signals to the transistor-based control circuit.

3. The multi-coil coupling-type SP4T switch as claimed in claim 2, wherein an nth control circuit of the control circuits comprises: an nth transistor, an nth gate bias resistor and an nth external resistor electrically connected between a substrate and a source of the nth transistor, wherein the nth is first, second, third and fourth in turn;

the nth gate bias resistor is electrically connected between a gate of the nth transistor and an nth control port of the first through fourth control ports, and a drain of the nth transistor is electrically connected in parallel with an nth output port of the first through fourth output ports, the source of the nth transistor is grounded, an end of the nth external resistor is electrically connected with the substrate of the nth transistor, and another end of the nth external resistor is grounded.

4. The multi-coil coupling-type SP4T switch as claimed in claim 3, wherein the first transistor is turned-off and the second through fourth transistors are turned-on, when the level signal provided by the first control port is at a first voltage level and the level signals provided by the second through fourth control ports are at a second voltage level, so that the input port is electrically conducted with the first output port.

5. The multi-coil coupling-type SP4T switch as claimed in claim 3, wherein the second transistor is turned-off, and the first transistor, the third transistor as well as the fourth transistor are turned-on, when the level signal provided by the second control port is at a first voltage level, and the level signals provided by the first control port, the third control port as well as the fourth control port are at a second voltage level, so that the input port is electrically conducted with the second output port.

6. The multi-coil coupling-type SP4T switch as claimed in claim 3, wherein the third transistor is turned-off, and the first transistor, the second transistor as well as the fourth transistor are turned-on, when the level signal provided by the third control port is at a first voltage level, and the level signals provided by the first control port, the second control port as well as the fourth control port are at a second voltage level, so that the input port is electrically conducted with the third output port.

7. The multi-coil coupling-type SP4T switch as claimed in claim 3, wherein the fourth transistor is turned-off, and the first through third transistors are turned-on, when the level signal provided by the fourth control port is at a first voltage level, and the level signals provided by the first through third control ports are at a second voltage level, so that the input port is electrically conducted with the fourth output port.

8. The multi-coil coupling-type SP4T switch as claimed in claim 1, further comprising:

a bypass capacitor, wherein an end of the bypass capacitor is electrically connected with the first inductor coil, and another end of the bypass capacitor is grounded.

9. A radio frequency integrated circuit comprising a multi-coil coupling-type single-pole four-throw (SP4T) switch, wherein the multi-coil coupling-type SP4T switch comprises:

an input port, a first output port, a second output port, a third output port and a fourth output port;

a coupled inductor circuit, comprising inductor coils electrically connected with the input port, the first output port, the second output port, the third output port and the fourth output port, wherein the coupled inductor circuit is configured to isolate the first output port, the second output port, the third output port and the fourth output port; and a transistor-based control circuit, comprising control circuits electrically connected with the first output port, the second output port, the third output port and the fourth output port respectively; wherein the transistor-based control circuit is configured for selecting one of the first through fourth output ports to be electrically conducted with the input port based on level signals of the control circuits, and configuring a load of the selected one of the first through fourth output ports by using the inductor coils electrically connected with the first through fourth output ports and the control circuits electrically connected with the others of the first through fourth output ports to thereby achieve a load matching for the selected one of the first through fourth output ports;

wherein the inductor coils of the coupled inductor circuit comprise: the first inductor coil, a second inductor coil and a third inductor coil; the first inductor coil is electrically connected with the input port, the second inductor coil is electrically connected between the first output port and the second output port, and the third inductor coil is electrically connected between the third output port and the fourth output port.

10. The radio frequency integrated circuit as claimed in claim 9, wherein the multi-coil coupling-type SP4T switch further comprises:

a control port group, wherein the control port group comprises a first control port, a second control port, a third control port and a fourth control port; the first control port is electrically connected with the first control circuit, the second control port is electrically connected with the second control circuit, the third control port is electrically connected with the third control circuit, the fourth control port is electrically connected with the fourth control circuit, and the control port group is configured for providing the level signals to the transistor-based control circuit.

11. The radio frequency integrated circuit as claimed in claim 10, wherein an nth control circuit of the control circuits comprises: an nth transistor, an nth gate bias resistor and an nth external resistor electrically connected between a substrate and a source of the nth transistor, wherein the nth is first, second, third and fourth in turn;

the nth gate bias resistor is electrically connected between a gate of the nth transistor and an nth control port of the first through fourth control ports, and a drain of the nth transistor is electrically connected in parallel with an nth output port of the first through fourth output ports, the source of the nth transistor is grounded, an end of the nth external resistor is electrically connected with the substrate of the nth transistor, and another end of the nth external resistor is grounded.

12. The radio frequency integrated circuit as claimed in claim 11, wherein the first transistor is turned-off and the second through fourth transistors are turned-on, when the level signal provided by the first control port is at a first voltage level and the level signals provided by the second through fourth control ports are at a second voltage level, so that the input port is electrically conducted with the first output port.

13. The radio frequency integrated circuit as claimed in claim 11, wherein the second transistor is turned-off, and the first transistor, the third transistor as well as the fourth transistor are turned-on, when the level signal provided by the second control port is at a first voltage level, and the level signals provided by the first control port, the third control port as well as the fourth control port are at a second voltage level, so that the input port is electrically conducted with the second output port.

14. The radio frequency integrated circuit as claimed in claim 11, wherein the third transistor is turned-off, and the first transistor, the second transistor as well as the fourth transistor are turned-on, when the level signal provided by the third control port is at a first voltage level, and the level signals provided by the first control port, the second control port as well as the fourth control port are at a second voltage level, so that the input port is electrically conducted with the third output port.

15. The radio frequency integrated circuit as claimed in claim 11, wherein the fourth transistor is turned-off, and the first through third transistors are turned-on, when the level signal provided by the fourth control port is at a first voltage level, and the level signals provided by the first through third control ports are at a second voltage level, so that the input port is electrically conducted with the fourth output port.

16. The radio frequency integrated circuit as claimed in claim 9, wherein the multi-coil coupling-type SP4T switch further comprises:

a bypass capacitor, wherein an end of the bypass capacitor is electrically connected with the first inductor coil, and another end of the bypass capacitor is grounded.

\* \* \* \* \*